United States Patent [19]

Rand et al.

[11] 3,765,935

[45] Oct. 16, 1973

[54] RADIATION RESISTANT COATINGS FOR SEMICONDUCTOR DEVICES

[75] Inventors: Myron Joel Rand, Bethlehem; Paul Felix Schmidt, Allentown, both of Pa.

[73] Assignee: Bell Telephone Laboratories Incorporated, Murray Hill, N.J.

[22] Filed: Aug. 10, 1971

[21] Appl. No.: 170,548

Related U.S. Application Data

[63] Continuation-in-part of Ser. No. 834,123, June 17, 1969, abandoned.

[52] U.S. Cl. ............. 117/201, 117/106 R, 117/213, 117/DIG. 12, 317/235 B, 317/235 AG

[51] Int. Cl. ............ B44d 1/18, C23b 5/62

[58] Field of Search ............ 117/201, 213, 217, 117/106, DIG. 12; 317/235

[56] References Cited

UNITED STATES PATENTS

| | | | |
|---|---|---|---|
| 3,558,348 | 1/1971 | Rand | 117/106 R |
| 3,520,722 | 7/1970 | Scott | 117/213 |

FOREIGN PATENTS OR APPLICATIONS

| | | | |
|---|---|---|---|
| 1,130,138 | 10/1968 | Great Britain | 117/DIG. 12 |

*Primary Examiner*—Alfred L. Leavitt
*Assistant Examiner*—M. F. Esposito
*Attorney*—R. J. Guenther et al.

[57] ABSTRACT

Radiation insensitive dielectric films are provided on semiconductor devices, both of the bipolar and the insulated gate, field effect type, by depositing silicon oxynitride coatings of particular compositions. The tolerance for ionizing radiation is thereby increased by a factor of about 100 compared to silicon dioxide coatings.

The silicon oxynitride dielectric coating prevents both the formation of a space charge in the dielectric, and the formation of interface states at the silicon interface. The initial surface charge of the devices prior to irradiation can be optimized by a chemical treatment of the silicon surface preceding the deposition of the silicon oxynitride film.

6 Claims, 8 Drawing Figures

SURFACE CHARGE VS. BIAS DURING IRRADIATION

RADIATION RESISTANT COATINGS FOR SEMICONDUCTOR DEVICES

This is a continuation-in-part of application Ser. No. 834,123, filed June 17, 1969 now abandoned by the same inventors and similarly assigned.

GOVERNMENT CONTRACT

The invention herein claimed was made in the course of the performance of a contract with the Department of the Army.

BACKGROUND OF THE INVENTION

Dielectric films are commonly used on semiconductor device surfaces for surface passivation and for insulation. In addition to their use for these purposes on bipolar and junction field effect devices, they are essential elements in semiconductor devices of the insulated gate, field effect type in which a metal film electrode is applied over a dielectric layer on the surface of a semiconductor body to enable the application of an electric field to the adjoining portion of the semiconductor body. A variety of devices depending upon this field effect are well known in the art.

It is also well recognized in the art that dielectric films may have a variety of advantageous characteristics for use not only in field effect devices but in other types of semiconductor devices. These characteristics include resistance to ion penetration, that is, passivation qualities, dielectric strength, and physical characteristics such as compatible thermal coefficient of expansion. In the patent of M. J. Rand, U.S. Pat. No. 3,558,348, issued Jan. 26, 1971, silicon oxynitride coatings are disclosed having particular, advantageous characteristics for semiconductor device use. Those characteristics relate to, in addition to passivation qualities, their thermal expansion compatibility with silicon substrates.

A further desirable characteristic, which has been difficult to achieve in the past is the ability to withstand the effects of radiation environments. Silicon dioxide passivated bipolar devices are less sensitive to ionizing radiation than silicon dioxide passivated insulated gate field effect devices, but they are readily degraded by neutron irradiation. Silicon dioxide passivated, insulated gate field effect devices (IGFETs), on the other hand, are nearly insensitive to neutron irradiation, but are strongly degraded by ionizing radiation (ultraviolet light, X-rays, gamma-rays, or charged particle irradiation) at absorbed doses as low as $5 \times 10^4$ rads.

The degradation of IGFETs stems both from the accumulation of a space charge in the dielectric coating (positive charge in silicon dioxide), and from the generation of new states at the silicon/dielectric interface. These interface states, depending on their location in terms of energy, can either cause a large surface recombination velocity, or they can trap or emit charge carriers even at high frequencies, thereby shifting the operating point of the semiconductor device, or degrading the I-V characteristic of reverse biased junctions.

What is needed then is a dielectric coating which, under irradiation of any kind, does not give rise to a shift in the operating point of the semiconductor device, be it due to the formation of space charge in the dielectric or to the generation of a high density of new interface states. In addition, the initial operating point of the device must lie at a conveniently small voltage, the dielectric must have a high dielectric strength, must not show drifts of the operating point under bias-temperature stress, and must prevent the penetration of ions or moisture to the dielectric/semiconductor interface.

The silicon oxynitride coating described in this invention has been found to meet all these requirements. In particular, it is insensitive to any kind of ionizing radiation well into the $10^7$ rads range, as well as to irradiation with neutrons.

SUMMARY OF THE INVENTION

In accordance with one aspect of this invention a silicon oxynitride film within a particular and limited range of compositions has been found to provide good resistance to ionizing radiation including gamma rays, X-rays, ultraviolet radiation and electron bombardment. In particular, these silicon oxynitride coatings are produced by a deposition process using nitric oxide (NO), silicon hydride ($SiH_4$), and ammonia ($NH_3$) in sufficient concentrations to produce a silicon oxynitride film having compositions within the range comprising 12–24 percent oxygen, 38–48 percent nitrogen and 37–40 percent silicon.

In addition to the foregoing silicon oxynitride compositions prepared by pyrolysis from $SiH_4$—$NH_3$—NO mixtures, another range of silicon oxynitride compositions prepared by pyrolysis from silicon hydride ($SiH_4$) and nitric oxide (NO) mixtures without ammonia ($NH_3$) has been found to exhibit insensitivity to ionizing radiation.

Accordingly, a feature of the invention is a dielectric film having suitable dielectric and physical characteristics, coupled with a radiation insensitivity which enables use under conditions of radiation exposure which would otherwise render the device inoperative or unsuitable.

BRIEF DESCRIPTION OF THE DRAWINGS

The invention and its other objects and features will be more clearly understood from the following detailed description taken in conjunction with the drawing in which.

DETAILED DESCRIPTION

Figure 1:
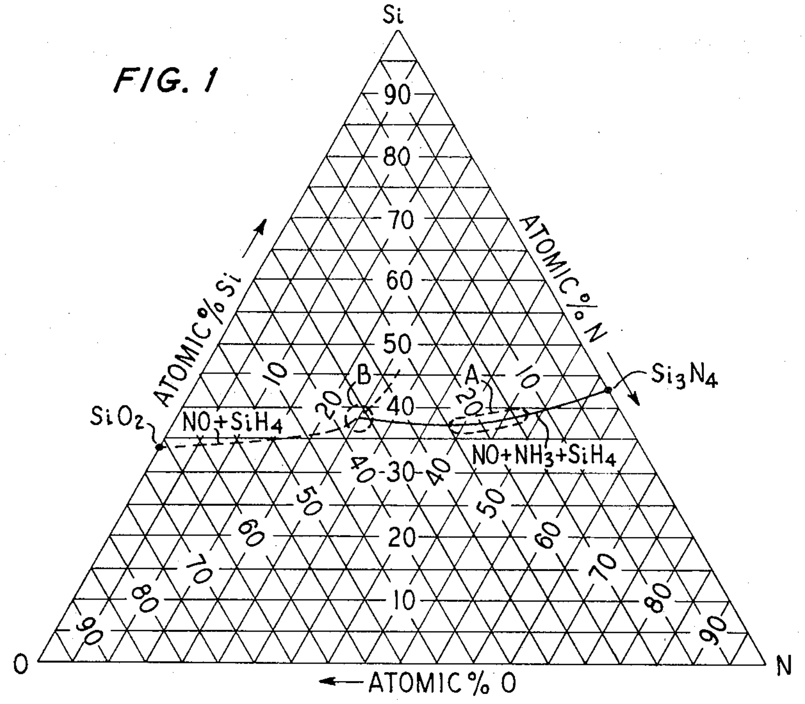
FIG. 1 is a three component diagram indicating the compositions of certain silicon oxynitride films providing a high degree of radiation insensitivity.

The process in accordance with this invention is similar both in apparatus and conditions to the process disclosed in the above-identified patent of Rand. In particular, the silicon semiconductor material suitably prepared for coating is mounted on a praphite pedestal in a vertical tube reaction chamber. A cylindrical radio frequency coil is provided around the chamber for heating and the reactant compounds are introduced into the reaction chamber at low concentrations in nitrogen carrier gas. Other suitable carrier gases include hydrogen, argon and helium. Reaction temperatures range from about 600° to 900°C with 850° being an advantageous reaction temperature.

In a particular embodiment silicon hydride or silane ($SiH_4$) was present in the nitrogen carrier gas at a concentration by volume of 0.015 percent, the nitric oxide (NO) at a concentration of 0.02 percent and the ammonia ($NH_3$) at a level of about 1–½ percent. Total gas flow through the reaction chamber and the corresponding linear velocity is comparable to that set forth in the above-identified Rand patent. In general, the deposition rate may be varied by variations in the silane concentration as well as by the temperature selected for the reaction. The composition of the silicon oxynitride film produced is, to a considerable extent, controlled by the relative concentrations of nitric oxide and ammonia, with increases in the nitric oxide to ammonia ratio tending to raise the oxygen content.

Typically, the foregoing process produces silicon oxynitride films having compositions located along the solid curve on the three component diagram. Further, if the concentrations of the three reactants given above are used, the compositions fall within the area labeled A. In particular, the foregoing described gas composition yields a silicon oxynitride film having a composition composed of 20 percent oxygen, 42 percent nitrogen and 38 percent silicon. However, films having compositions falling within area A and ranging from 12–24 percent oxygen, 38–48 percent nitrogen and 37–40 percent silicon exhibit a high degree of radiation insensitivity. These compositions have refractive indices falling in the range from about 1.74 to 1.82.

Another range of compositions has been found to exhibit radiation insensitivity as defined by area B on the phase diagram. Films of these compositional ranges are produced by the reaction process disclosed in the above-noted patent of M. J. Rand utilizing nitric oxide and silane and omitting the ammonia as previously described herein. These silicon oxynitride films produced in accordance with the Rand technique fall along the broken curve identified by the two constituent reactants nitric oxide (NO) and silane ($SiH_4$). The particular compositional range of silicon oxynitride films found to be useful as radiation insensitive coatings are produced by utilizing the two reactants, nitric oxide and silane, in a molar ratio of one to one, to produce a film having the composition approximately 37 percent oxygen, 25 percent nitrogen and 38 percent silicon. Generally, films produced by this process and close to the above composition will exhibit a high degree of radiation insensitivity.

If silicon oxynitride is deposited directly on silicon, both epitaxial or freshly hydrofluoric acid etched surfaces, there is a large positive surface charge, which shifts the operating point to negative voltages too large for most applications. It has been found that this condition can be avoided by pre-treating the silicon surface with an aqueous mixture of hydrogen peroxide and ammonia in the pH range of about 8–9. This treatment introduces a negative surface charge without affecting the radiation hardness of the oxynitride film subsequently deposited. The surface pre-treatment causes an increase in oxide thickness of only 2–3 A (silicon surfaces after etching in hydrofluoric acid exposure to air are covered with an oxide film of 10–12 A thickness, as measured ellipsometrically).

A subsequent annealing step in hydrogen gas shifts the operating point into the desired range of very small voltages, and at the same time reduces the high density of interface states present after the pyrolytic deposition step. This annealing step in hydrogen can be done either at 900°C for about 15 minutes or preferably at lower temperatures for longer periods of time. For instance, three hours at 500°C is suitable.

A reduction in surface charge density can also be achieved by interposing a thin oxide film between silicon surface and silicon oxynitride film, but the thickness of this thin oxide film should not exceed 40 A, otherwise there will occur an ionic type instability under irradiation if the interface states have been eliminated by a hydrogen anneal. This elimination of the interface states, as pointed out before, is a necessity for satisfactory device performance. Interposition of an oxide film not exceeding 40 A is thus not detrimental, but does not provide any advantage over the direct deposition of silicon oxynitride on a surface which has been pretreated but is an essentially oxide-free (10–15 A) silicon substrate.

Referring again to FIG. 1 two ranges of silicon oxynitride compositions exhibiting radiation insensitivity are delineated on the component diagram. The range indicated by the letter A designates the compositions produced by the hydride-ammonia-nitric oxide system which are the preferred compositions. The range of compositions indicated by B produced by the hydride-nitric oxide system have not been explored in great detail because of the practical difficulty of preventing inclusion of excess silicon in the depositing film; the broken curve representing silicon oxynitride compositions of different nitrogen to oxygen ratios rises steeply towards the silicon apex just beyond the area marked B.

To illustrate the efficacy of the particular silicon oxynitride composition preferred in accordance with this invenion, Table I, below, sets forth the behavior of the so-called flatband voltage ($V_{fb}$) under irradiation with $Co^{60}$-gammas with positive bias applied to the field plate of a metal-insulator-semiconductor capacitor. The flatband voltage of a metal-insulator-semiconductor (MIS) device generally is that voltage applied to the field plate which just counterbalances the combined effect of the work function difference of the electrodes, the charge in the insulator layer, and the charge at the oxide-to-semiconductor interface. While the flatband voltage is not identical to the operating point of a transistor, it is a good indicator of its stability under irradiation. Any shift in the flatband voltage corresponds to a shift in the operating point of equal or greater magnitude. It can be seen from Table I that changes in the flatband voltage under irradiation become very small or zero in the composition ranges corresponding to areas A and B in FIG. 1.

TABLE 1

Voltage stability was tested by short-time biasing at a field strength of 2 × $10^6$V/cm at room temperature. Radiation sensitivity was tested by exposure to $Co^{60}$-gammas at 1 × $10^6$V/cm at room temperature.

A. Films deposited from mixtures of $SiH_4$—$NH_3$—NO

| Composition of Film in Atomic % | | | Voltage Stability | Shift in $V_{fb}$ Under Irradiation |
|---|---|---|---|---|
| O | N | Si | | |
| 40.5 | 22.0 | 37.5 | excellent | – 25.0 V |
| 22.5 | 39.5 | 38.0 | excellent | – 1.0 V |
| 15.0 | 46.8 | 38.2 | good | near zero |
| 14.0 | 47.0 | 39.0 | poor | near zero |
| 0 | 57 | 43 ($Si_3N_4$) | extremely unstable | voltage instability prevents meaningful measurement |

B. Films deposited from mixtures of $SiH_4$—NO

| Composition of Film in Atomic % | | | Voltage Stability | Shift in $V_{fb}$ Under Irradiation |
|---|---|---|---|---|
| O | N | Si | | |
| 56.5 | 9.0 | 34.5 | very good | – 20.0 V |
| 44.0 | 21.5 | 34.5 | very good | – 7.5 V |
| 37.0 | 24.5 | 38.5 | good | – 0.5 V |

In the foregoing table the silicon oxynitride films constituted the insulator layer of the field effect structure of the device. The structures referred to in Table I were produced by depositing films on silicon surfaces etched in hydrofluoric acid.

Silicon semiconductor devices of both the insulated gate field effect type and the bipolar type have been coated with silicon oxynitride compositions in accordance with this invention for testing under a variety of forms of radiation. Silicon-silicon oxynitride-metal capacitors have been subjected to $Co^{60}$-gamma rays, copper $K_\alpha$ - X-rays, vacuum ultraviolet, and 25 keV electron bombardment under both cumulative doses and under microsecond bursts of 5 × $10^4$ rads per pulse, as well as to a neutron dose of 3 × $10^{12}$ 14 meV neutrons per square centimeter, while being biased at fields of ±3 × $10^5$V/cm, and were found to be radiation hard, as shown in FIGS. 2 and 3.

Silicon oxynitride passivated field effect transistors have been tested under exposure to $Co^{60}$-gamma radiation and the results are depicted in FIGS. 4, 6, 7 and 8. The field effect transistors used in these experiments had channel lengths of 6–7 microns, and in one case, a channel width of 2.1 mils, in the other case of 4.2 mils. Both devices were P-channel type devices, and were fabricated by diffusion of the source and drain regions to a depth of 2 microns, the source and drain regions having a surface concentration of 2 × $10^{19}$ $cm^{-3}$. The N type silicon substrate had a doping density of 1 × $10^{15}$ $cm^{-3}$.

Figure 5:
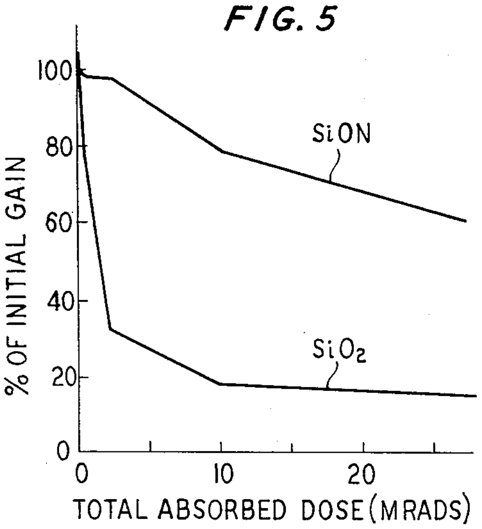
FIG. 5 is a graph showing the degradation of the initial low current (10 microamperes) gain of silicon oxynitride and of silicon dioxide passivated bipolar NPN transistors of Western Electric Type 16F as a function of absorbed radiation dose.

The bipolar transistors treated in accordance with this invention were of the NPN configuration and were Western Electric Type 16F devices of the following description: the collector substrate was 0.7 ohm/cm N type, the base region was boron diffused to a depth of 0.2 mils and a surface concentration of 1 × $10^{18}$ $cm^{-3}$, having a diameter of 9.8. The emitter was phosphorous diffused to a depth of 0.142 mils and a surface concentration of 2 × $10^{20}$ $cm^{-3}$ and had a diameter of 5.4 mils. The results of radiation testing of the silicon dioxide and silicon oxynitride passivated bipolar transistors is shown in FIG. 5.

Figure 2:
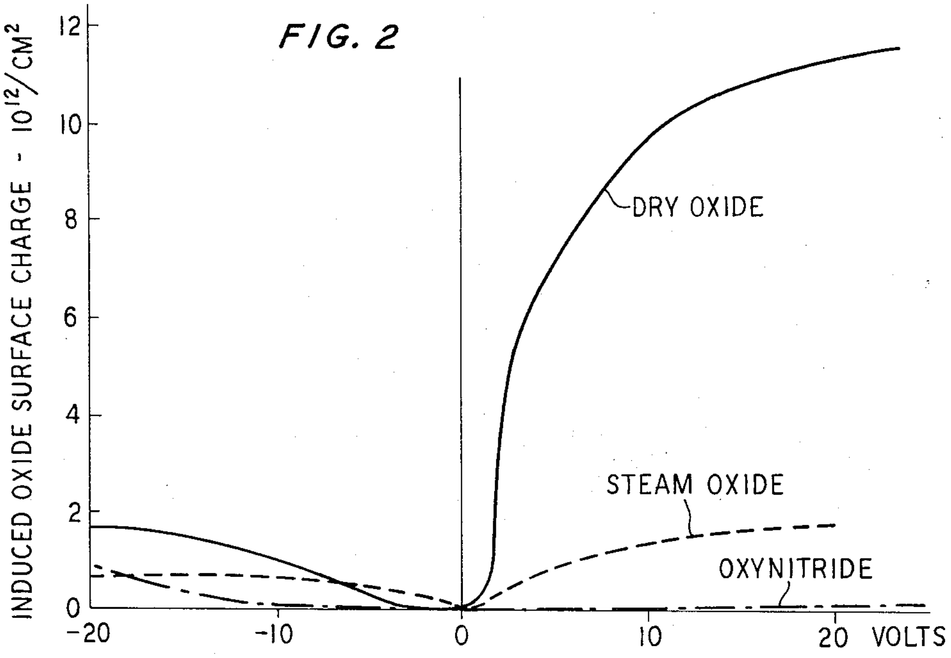
FIG. 2 is a graph depicting the effect of ionizing radiation on induced oxide surface charge for steam grown and dry-oxygen grown silicon dioxide films and for silicon oxynitride films.
Figure 3:
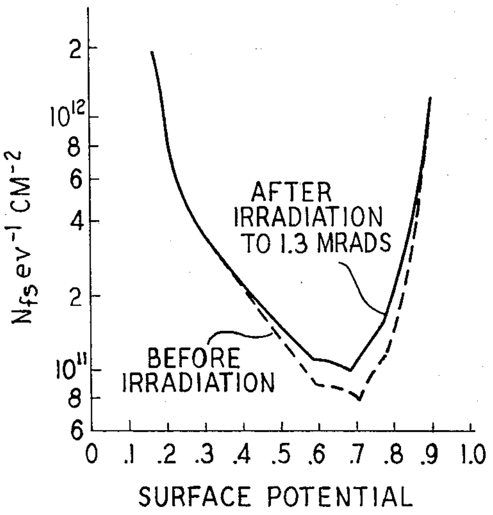
FIG. 3 is a graph showing the interface state density $eV^{-1}$ $cm^{-2}$ as a function of surface potential for a silicon oxynitride covered silicon surface before and after irradiation to an absorbed dose of $1.3 \times 10^6$ rads.

Referring to FIG. 2 the effects of equivalent radiation on IGFET devices having only silicon oxide coatings and upon a device having silicon oxynitride coating in accordance with this invention are compared. In the graph induced silicon surface charge is plotted against the value of bias applied during radiation. The curves for the two types of silicon dioxide film are taken from a publication by K. H. Zaininger et al, RCA Review 28, 208 (1967). The curve for silicon oxynitride films were attained at an absorbed dose of 1.6 × $10^6$ rads which is a four times larger dose than that used for the silicon dioxide film devices.

Referring to FIG. 3 the two curves illustrate the interface state densities on a silicon surface covered by silicon oxynitride in accordance with this invention before and after irradiation to an absorbed dose of 1.3 × $10^6$ rads. The device used was of the MOS capacitor type as described above having a silicon oxynitride film baked at 900°C for one-half hour in hydrogen after application on a chemically treated silicon surface. Measurements before and after irradiation were made using the quasi-static technique, as set forth by M. Kuhn, Solid State Electronics 13, 873 (1970). By comparison, the interface state density of a similarly hydrogen annealed silicon-silicon dioxide interface would be in excess of $10^{12}$ states $eV^{-1}$ $cm^{-2}$ at the minimum of the curve after exposure to a similar radiation dose, as set forth by K. H. Zaininger in RCA Technical Report AFAL-TR-69-185, page 41 (August 1969).

Figure 4:
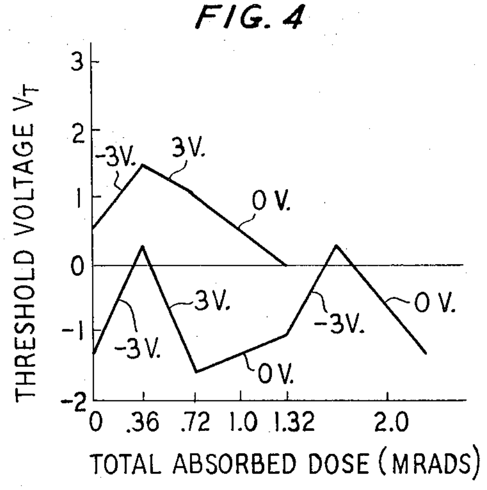
FIG. 4 is a graph showing the shifts in operating point of two typical silicon oxynitride passivated IGFETs as a function of absorbed radiation dose with the biasing condition as parameter.

In FIG. 4 there is depicted the irradiation response in terms of threshold voltage of silicon oxynitride passivated field effect devices. Threshold voltage is plotted against radiation dose and biasing condition during such irradiation. It can be seen that the shift in operating point for both devices is less than 1.5 volts. Devices have also been fabricated in accordance with this invention which showed a zero shift in threshold voltage or opeating point under similar conditions of radiation and bias. These devices utilized a silicon oxynitride film for the field effect gate having a thickness of 1,700 A, the silicon oxynitride film having a refractive index of $n$ = 1.78. The film was deposited on a silicon surface pretreated in hydrogen peroxide and ammonia at a pH of 9 as previously described.

Generally, suitable thicknesses of silicon oxynitride films are determined by requirements other than the provision of radiation resistance. Silicon oxynitride coatings in accordance with this invention of any appreciable thickness, that is, even as thin as several hundred A, would provide relatively complete radiation hardness. However, practical thicknesses generally exceed at least 1,000 A and are typically in the range from 1,500 to 2,000 A. Coatings of this thickness are required in order to provide structurally sound coatings, free of pin holes and the like, as well as to produce the desired electrical characteristics, particularly in field effect devices.

Figure 6:
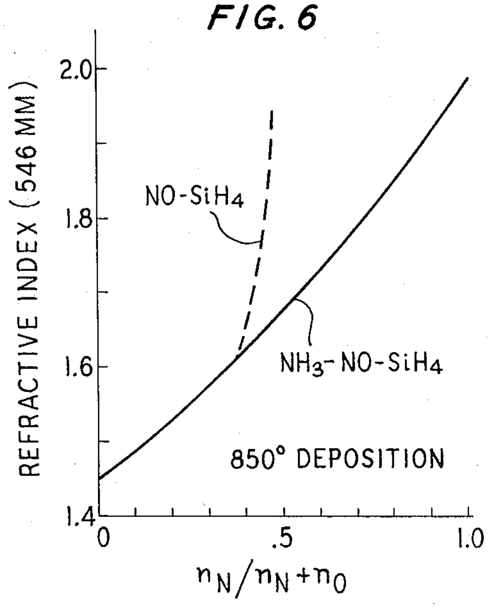
FIG. 6 is a graph depicting the refractive index for various silicon oxynitride compositions.

In FIG. 5 there is shown the average degradation of the 10 micro-ampere gain of silicon oxynitride coated and silicon dioxide coated bipolar transistors as previously described under $Co^{60}$-gamma irradiation as a function of radiation dose. The silicon oxynitride passivated transistor was processed in the conventional manner up to the point where contact windows to the several conductivity type zones would normally be opened. Then, all silicon oxide was removed and a 1,500 A thick silicon oxynitride film having a refractive index $n = 1.78$ was deposited over the entire wafer. It was then annealed in hydrogen at 900°C for one-half hour. Referring to the graph of FIG. 5 it will be noted that the silicon dioxide passivated transistors are degraded to about one-third of the initial value of gain following an absorbed dose of about $2 \times 10^6$ rads. This is a large dose compared to the dose required to degrade silicon dioxide coated IGFETs, however, silicon oxynitride passivated bipolar transistors would require, on the basis of extrapolation, a dose of at least $70 \times 10^6$ rads to show the same degree of degradation. Generally, devices having silicon oxynitride coatings were found to have good stability provided the refractive index of the coating, deposited from the hydride-ammonia-nitric oxide system, fell into the range from 1.74 to 1.82. The relation between refractive index and composition is shown in the graph of FIG. 6. In this graph refractive index is plotted against composition of the silicon oxynitride film expressed as the ratio of the molar fraction of nitrogen $n_N$ over the sum of molar fractions of nitrogen and oxygen $(n_N + n_O)$. The molar fraction of silicon thus is the difference between unity and the sum of the molar fractions of nitrogen and oxygen $(1 - [n_N + n_O])$. The curve designated $NH_3$—NO—$SiH_4$ indicates that the range defined by refractive index 1.74 – 1.82 corresponds to the compositions of the area A of FIG. 1. In general, good stability was observed up to absorbed radiation doses of $10^8$ rads.

If the refractive index of films produced by the $NH_3$—NO—$SiH_4$ method drops below 1.74, the device under irradiation will show the build-up of a positive space charge in the dielectric, in other words, it begins to show the same type of degradation as observed in silicon dioxide passivated devices. If the refractive index rises above 1.82, the device is degraded already by the prolonged application of the operating voltage, that is, it shows the same type of charge injection into the dielectric under applied bias that is typical of silicon nitride films deposited on silicon surfaces. The presence of ionizing irradiation accelerates the shift in operating point which would have occurred also under application of the bias alone over a sufficient period of time. The physical cause for this degradation at refractive indices above 1.82 lies in the decrease of forbidden gap width as one traverses the silicon oxynitride compositions in the direction from silicon dioxide to silicon nitride. At a refractive index of 1.82 the forbidden gap has become small enough that the application of a high electric field, corresponding to the operating voltage of a practical device, leads to the injection of charge carriers into the dielectric from the electrodes, either the metal contact or the silicon interface. The stability under applied voltage of silicon oxynitride films in the refractive index range below 1.82 is thus due to a sufficient width of the forbidden gap, the stability under irradiation with bias is due to fast internal recombination mechanisms for holes and electrons. These mechanisms are lacking in silicon dioxide because of its different chemical composition.

Figure 7:
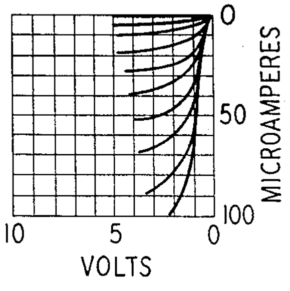
FIGS. 7 and 8 are graphs showing standard transistor characteristics of a silicon oxynitride passivated field effect transistor following a series of radiation exposures.
Figure 8:
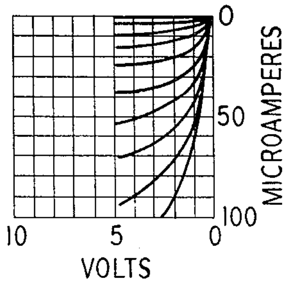

A further indication of the efficacy of silicon oxynitride coatings in accordance with this invention is given by the graph of FIGS. 7 and 8. In these graphs typical transistor characteristics are shown after different amounts of absorbed radiation doses on silicon oxynitride passivated P-channel IGFETs of the type described above. In the graphs the vertical scale is divided in 10 microampere divisions while the horizontal scale is 1 volt per division. The steps between traces are 200 millivolts and the transconductance is 50 microns per division. In FIG. 7 the characteristics were taken after irradiation at −3V to an absorbed dose of 0.36 megarads. In FIG. 8 the device was tested after a second irradiation at −3V, the device having an absorbed 1.32 megarads between measurements. The absence of substantial change following successive exposures is apparent.

Although the invention has been disclosed in terms of silicon oxynitride films deposited on a silicon substrate, the use of semiconductor substrates other than silicon should be feasible since the mechanism of radiation hardness resides in the dielectric, not in the semiconductor substrate. Germanium or III-V compound semiconductors may be suitable for this purpose.

What is claimed is:

1. A semiconductor device comprising a silicon semiconductor body having on one surface thereof a coating of silicon oxynitride including by atomic percentage 12–24 percent oxygen, 38–48 percent nitrogen and 37–40 percent silicon.

2. A semiconductor device in accordance with claim 1 in which said coating has a composition of 20 percent oxygen, 42 percent nitrogen and 38 percent silicon.

3. The method of providing a radiation resistant coating on a silicon semiconductor device comprising treating a surface of a silicon semiconductor body with an aqueous mixture of hydrogen peroxide and ammonia having a pH in the range of about 8–9 and forming on said surface by pyrolytic deposition a film having a composition in the range of 12–24 percent oxygen, 38–48 percent nitrogen and 37–40 percent silicon by atomic percentage.

4. The method in accordance with claim 3 in which the formation of said film is followed by a heat treatment in a hydrogen ambient at about 500°C for about three hours.

5. The method in accordance with claim 3 in which the formation of said film is followed by a heat treatment in a hydrogen ambient at about 900°C for about 15 minutes.

6. The method in accordance with claim 3 in which the deposition of said film is preceded by the formation by thermal growth of a thin silicon oxide film which does not exceed 40 A in thickness.

* * * * *